United States Patent
Wu

(10) Patent No.: US 7,075,138 B2
(45) Date of Patent: Jul. 11, 2006

(54) BITLINE STRUCTURE FOR DRAM AND METHOD OF FORMING THE SAME

(75) Inventor: Kuo-Chien Wu, Miaoli (TW)

(73) Assignee: Nanya Technology Corporation, Taoyuan (TW)

(*) Notice: Subject to any disclaimer, the term of this patent is extended or adjusted under 35 U.S.C. 154(b) by 35 days.

(21) Appl. No.: 10/752,961

(22) Filed: Jan. 7, 2004

(65) Prior Publication Data

US 2004/0140496 A1 Jul. 22, 2004

Related U.S. Application Data

(62) Division of application No. 10/397,477, filed on Mar. 26, 2003, now Pat. No. 6,790,771.

(30) Foreign Application Priority Data

Dec. 2, 2002 (TW) .............................. 91134945 A

(51) Int. Cl.
*H01L 27/108* (2006.01)

(52) U.S. Cl. ........................ 257/306; 257/382

(58) Field of Classification Search ............ 257/306, 257/382, 369, 773

See application file for complete search history.

(56) References Cited

U.S. PATENT DOCUMENTS

| | | | | |
|---|---|---|---|---|
| 6,008,084 A * | 12/1999 | Sung | ............................ | 438/241 |
| 6,255,685 B1 * | 7/2001 | Kuroda | ........................ | 257/306 |
| 6,784,501 B1 * | 8/2004 | Lane et al. | .................. | 257/382 |
| 6,790,771 B1 * | 9/2004 | Wu | ............................. | 438/637 |

\* cited by examiner

*Primary Examiner*—Mark V. Prenty
(74) *Attorney, Agent, or Firm*—Quintero Law Office

(57) ABSTRACT

A bitline structure for DRAM and the method for forming the same. The bitline structure includes a first dielectric layer on a substrate, a bitline contact hole, formed through the first dielectric layer, a bitline contact, formed in the bitline contact hole, a second dielectric layer, formed on the first dielectric layer and covering the bitline contact, a peripheral contact hole, formed through the first dielectric layer and the second dielectric layer, a peripheral contact, formed in the peripheral contact hole, a first bitline, formed in the second dielectric layer and contacting the bitline contact, and a second bitline, formed in the second dielectric layer and contacting the peripheral contact.

6 Claims, 9 Drawing Sheets

BITLINE STRUCTURE FOR DRAM AND METHOD OF FORMING THE SAME

CROSS-REFERENCE TO RELATED APPLICATIONS

This application is a divisional of U.S. application Ser. No. 10/397,477, filed on Mar. 26, 2003, now U.S. Pat. No. 6,790,771.

BACKGROUND OF THE INVENTION

1. Field of the Invention

The present invention relates to a fabrication process for DRAM, and in particular to a bitline structure for DRAM and method of forming the same.

2. Description of the Related Art

Random access memory (RAM) is a volatile memory, usually categorized into static RAM (SRAM) and dynamic RAM (DRAM). SRAM stores information by the conductive state of the transistors in the memory cells, while digital signals from DRAM are determined by the charging states of capacitors in the memory cells. In RAM, information access is controlled by word lines connecting gates and bitlines that connect source/drain.

Conventional bitlines are mostly metal, with silicide preferred. Tungsten silicide and tungsten are the most widely used, as they exhibit high melting point, stability and low resistance.

FIG. 1 illustrates a cross section of a conventional bitline structure. 10 represents a substrate, 12 represents the dielectric layer, and 14, 20, 22, 24 are bitlines of metal, for example, tungsten. 16 represents a contact to bitline and 18 represents a peripheral contact.

The process for forming the above bitlines is shown as a flowchart in FIG. 2. A contact to bitline is first formed in a dielectric layer of a semiconductor substrate by photolithography and etching in step S10. Next, conductive material is filled in the contact to bitline in step S20. Etching back is then carried out in step S30 to lower the surface of the conductive material below the surface of the dielectric layer. Then, a peripheral contact is formed by photolithography and etching in step S40A. Exposure and etching are then performed to define bitlines. Next, a conductive material, such as tungsten, fills the contact to bitline and the peripheral contact to form bitlines. After completion of the bitlines, chemical mechanical polishing polishes the surface of the bitlines to create a smooth surface as illustrated in FIG. 1.

Shortcomings of the conventional process described above are overlapping bitlines due to high integration, causing shorts easily, illustrated as P between bitlines BL1 and BL2 in FIG. 6B. This adversely affects production yield.

SUMMARY OF THE INVENTION

Accordingly, an object of the invention is to provide a method for forming bitlines for DRAM that solve the overlapping problems and improve production yields.

A major feature of the method forming bitlines for DRAM of the present invention is formation of a dielectric layer to cover the contact to bitline, followed by simultaneous formation of a peripheral contact and a bitline trench in a position relative to the contact to bitline in the dielectric layer. Alternatively, a bitline contact landing having a widened area is formed on the contact to bitline, followed by formation of a bitline trench. Conductive material then fills the bitline trench to form a bitline.

The method for forming bitlines for DRAM includes providing a semiconductor substrate having a first dielectric layer formed thereon and a contact hole through the dielectric layer, filling the contact hole with a conductive material to form a first conductive layer and etching back the first conductive layer to below the first dielectric layer, increasing the opening of the contact hole by isotropic etching to form a first opening, filling the first opening with conductive layer to form a bitline contact landing, forming a second dielectric layer on the entire first dielectric layer to cover the bitline contact landing, forming a peripheral contact hole and defining a first bitline trench simultaneously to expose the bitline contact landing, defining a second bitline trench in the second dielectric layer to expose the peripheral contact hole, and filling the peripheral contact hole, the first bitline trench and the second bitline trench with conductive material to form a peripheral contact, a first bitline and a second bitline.

According to another embodiment of the invention, the method for forming bitlines for DRAM comprises providing a semiconductor substrate having a first dielectric layer formed thereon and a contact hole through the dielectric layer, filling the contact hole with a conductive material to form a first conductive layer, forming a second dielectric layer on the first dielectric layer to entirely cover the first conductive layer, forming a peripheral contact hole and defining a first bitline trench in the second dielectric layer, defining a second bitline trench in the second dielectric layer to expose the peripheral contact hole, and filling the peripheral contact hole, the first bitline trench and the second bitline trench with conductive material to form a peripheral contact, a first bitline and a second bitline.

According to the invention, the bitline structure comprises a substrate, a first dielectric layer, formed on the substrate, a bitline contact hole, through the first dielectric layer, a bitline contact, formed in the bitline contact hole, a second dielectric layer, formed on the entire first dielectric layer and covering the bitline contact, a peripheral contact hole, formed through the first dielectric layer and the second dielectric layer, a peripheral contact, formed in the peripheral contact hole, a first bitline, formed in the second dielectric layer and contacting the bitline contact, and a second bitline, formed in the second dielectric layer and contacting the peripheral contact.

According to another embodiment, the bitline structure further comprises a bitline contact landing, formed in the first dielectric layer between the contact to bitline and the bitline for connecting both.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

1st Embodiment

FIGS. 4A–4E are cross sections of this embodiment of the method for forming bitlines of DRAM according to the invention.

Figure 4A:
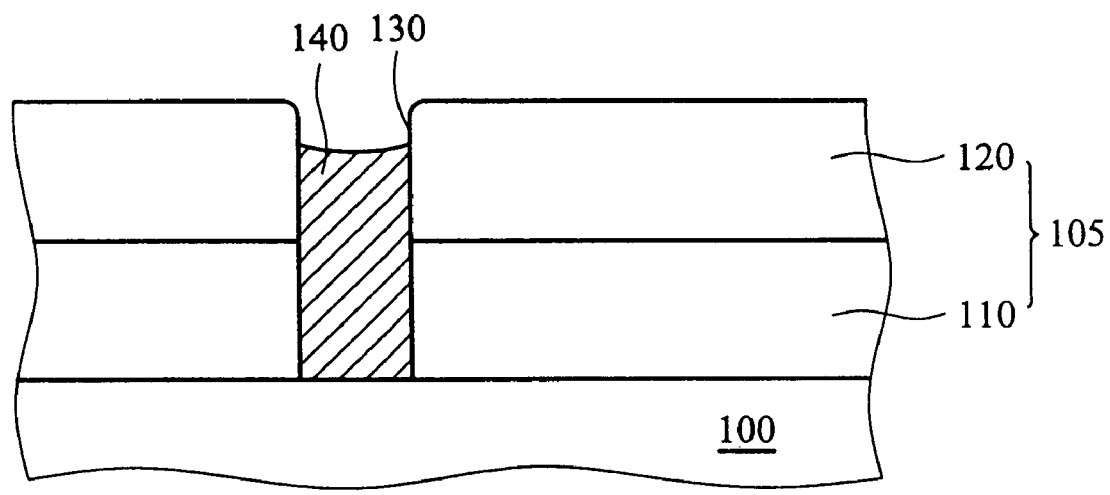
FIGS. 4A~4E are cross sections according to the $1^{st}$ embodiment of the method for forming bitlines of DRAM according to the invention.

A semiconductor 100 having a first dielectric layer 105 formed thereon, as shown in FIG. 4A, is provided. The first dielectric layer 105 is comprised of boron phosphorous silicon glass (BPSG) layer 110 and tetraethylorthosilane (TEOS) layer 120. Step S10 of photographic and etching is then performed to form a bitline contact hole 130. Next, in step S20, conductive material, preferably polysilicon, fills the bitline contact hole 130 to form a first conductive layer 140, acting as the bitline contact. In step S30, back etching using wet etching lowers the surface of the first conductive layer below the surface of the first dielectric layer 105.

Figure 4B:
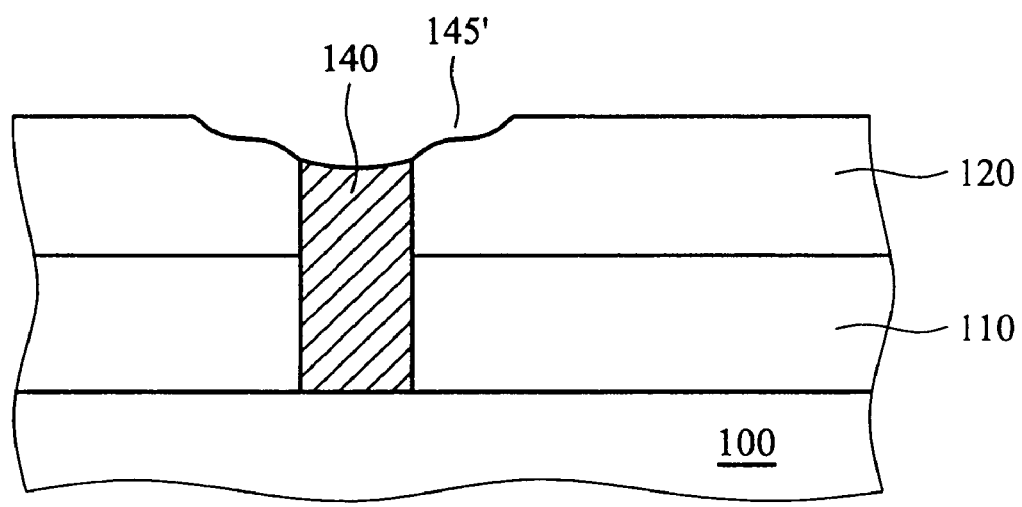
Figure 4C:
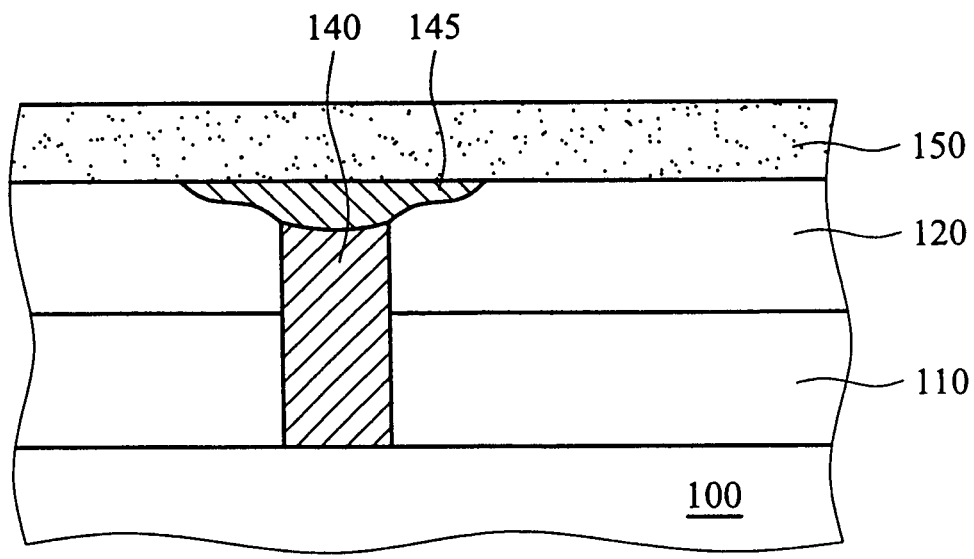

Next, in FIG. 4B, step S32 is performed to widen the opening of the bitline contact hole 130 to form a first opening 145'. This step is carried out by wet etching using preferably buffered oxide etchant (BOE) or hydrogen fluoride (HF). Then, step S34 fills conductive material I into the first opening 145' to form a bitline contact landing 145, as shown in FIG. 4C. The conductive material is preferably polysilicon. A second dielectric layer 150 is then formed in step S36 to cover the bitline contact landing 145 and the TEOS layer 120. The second dielectric layer is preferably TEOS.

Figure 4D:
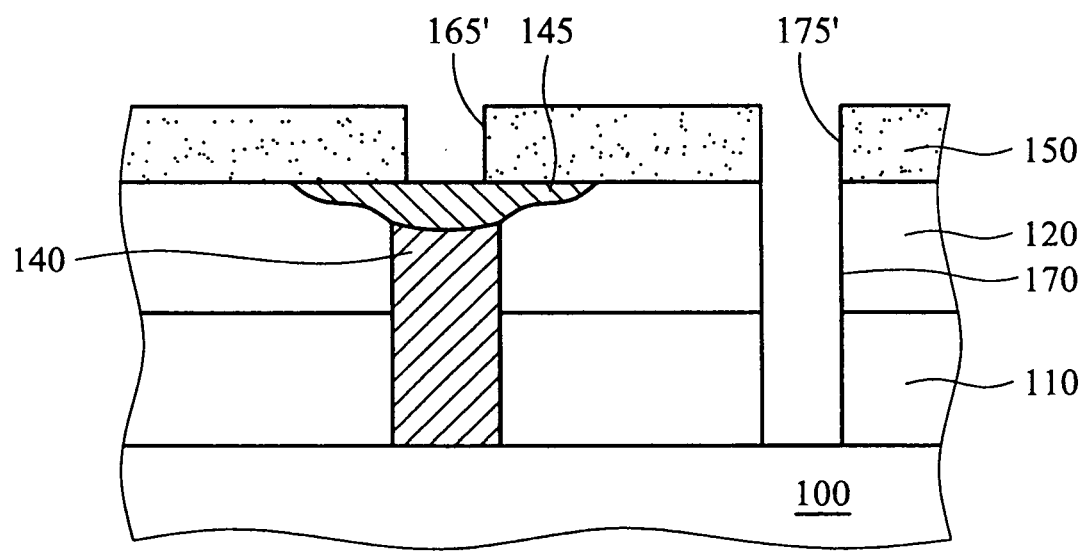

Next, as shown in FIG. 4D, exposure is performed in step S40B to simultaneously define a contact hole in a peripheral 170 and a first bitline trench 165' in the second dielectric layer corresponding to the position of the bitline contact landing 145. Then, a second bitline trench 175' is formed in the second dielectric layer 150 to expose the contact hole in 170.

Figure 4E:
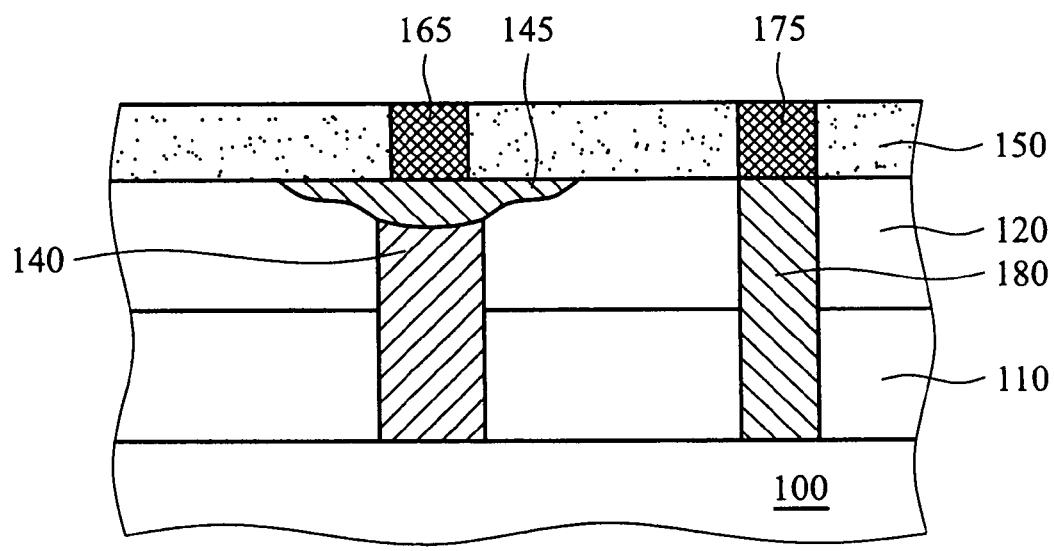

Finally, as shown in FIG. 4E, conductive material fills the contact hole in a peripheral 170, the first bitline trench 165' and the second bitline trench 175' in step S50 to form a contact to a peripheral 180, a first bitline 165, and a second bitline 175. Conductive material is preferably tungsten, but other metal, such as titanium is applicable as well.

After the above steps, chemical mechanical polishing (CMP) polishes the surface of the bitlines and removes excess metal to obtain a smooth surface.

2nd Embodiment

This example omits the steps S32 and S34 as described in Example 1.

Figure 1:
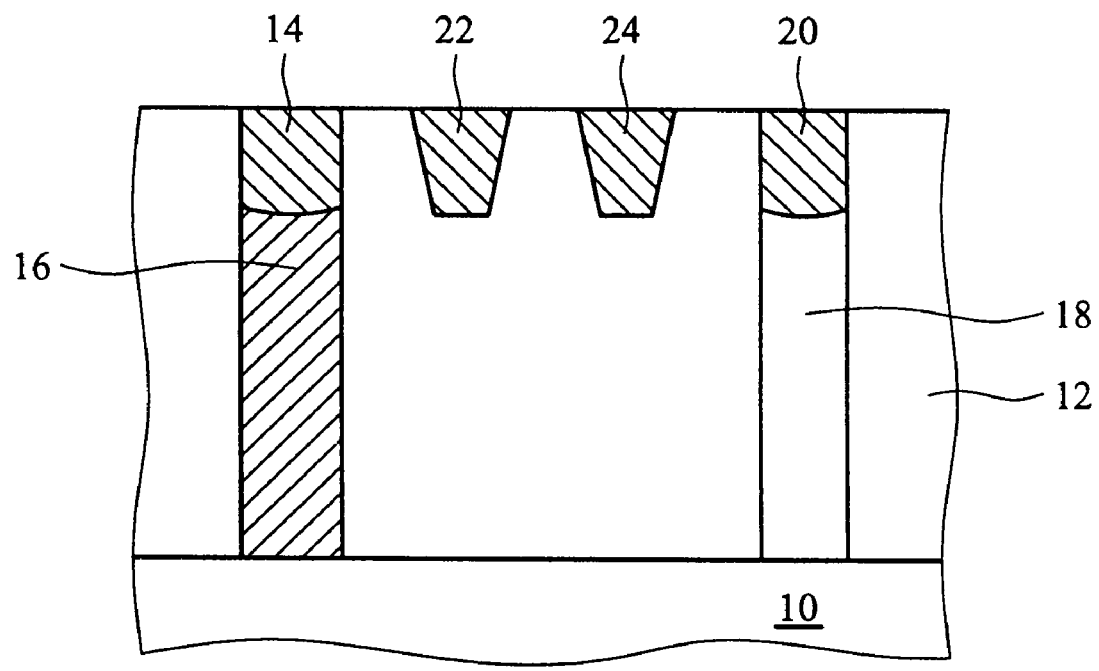
FIG. 1 is cross section of a conventional bitline of DRAM.
Figure 2:
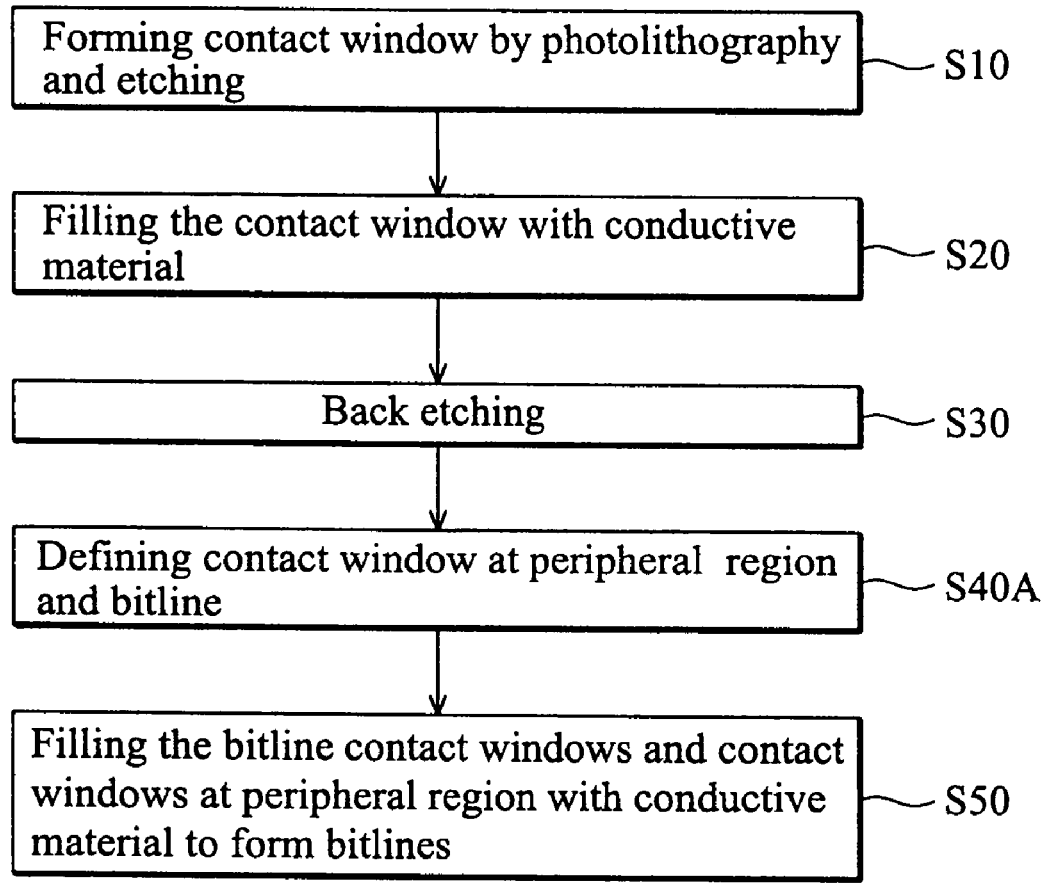
FIG. 2 is a flowchart showing a conventional process for fabricating bitlines of DRAM.
Figure 3:
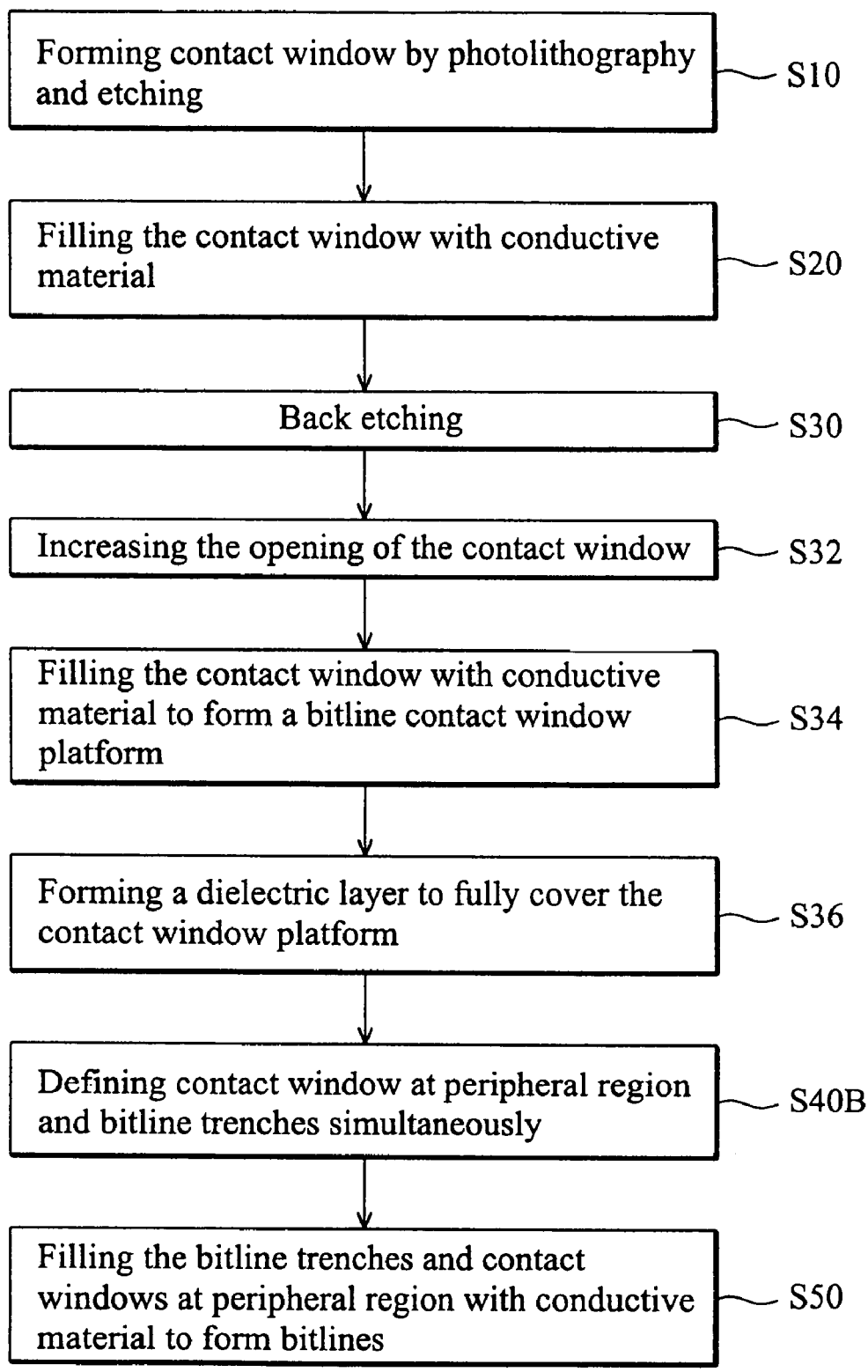
FIG. 3 is a flowchart showing the method for forming bitlines of DRAM according to the invention.

FIGS. 5A–5D are cross sections according to the 2nd embodiment of the method for forming bitlines of DRAM according to the invention. A detailed flowchart of this example is shown in FIG. 3.

Figure 5A:
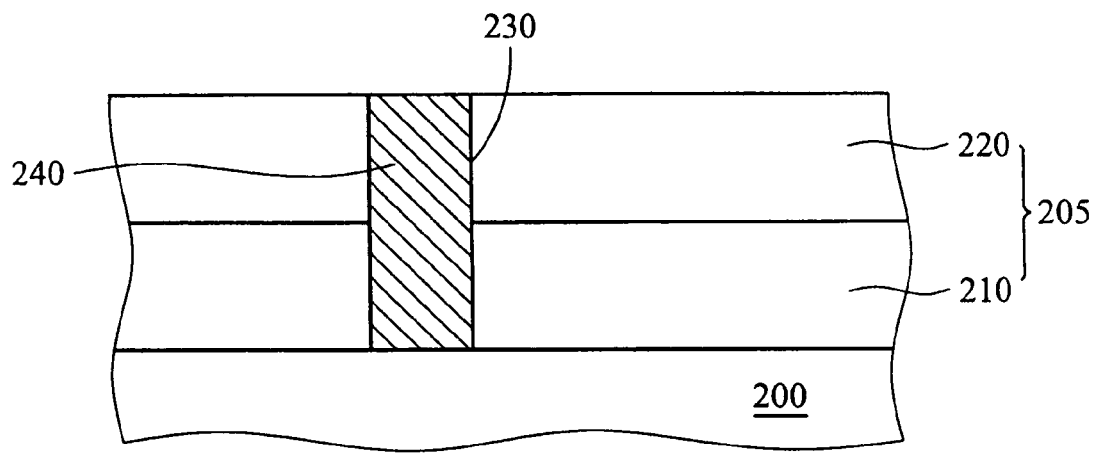
FIGS. 5A–5D are cross sections according to the 2nd embodiment of the method for forming bitlines of DRAM according to the invention.

A semiconductor 200 having a first dielectric layer 205 formed thereon, as shown in FIG. 5A, is provided. The first dielectric layer 205 is comprised of boron phosphorous silicon glass (BPSG) 210 and tetraethylorthosilane (TEOS) 220. Step S10 of photographic and etching is then performed to form a bitline contact hole 230. Next, in step S20, conductive material, preferably polysilicon, fills the bitline contact hole 230 to form a first conductive layer 240, acting as the bitline contact. In S30, back etching using wet etching lowers the surface of the first conductive layer below the surface of the first dielectric layer 205.

Figure 5B:
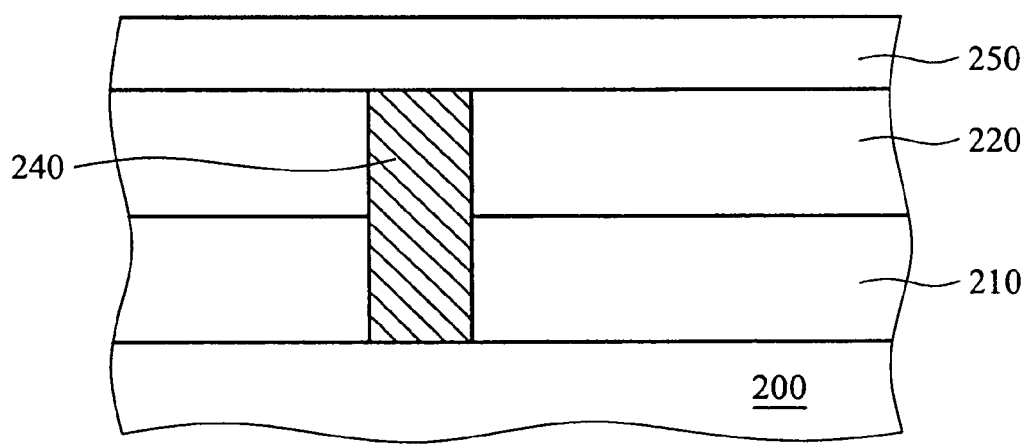

Next, in FIG. 5B, a second dielectric layer 250 is then formed in step S36 to cover the first dielectric layer 240 and the TEOS layer 220. The second dielectric layer is preferably TEOS.

Figure 5C:
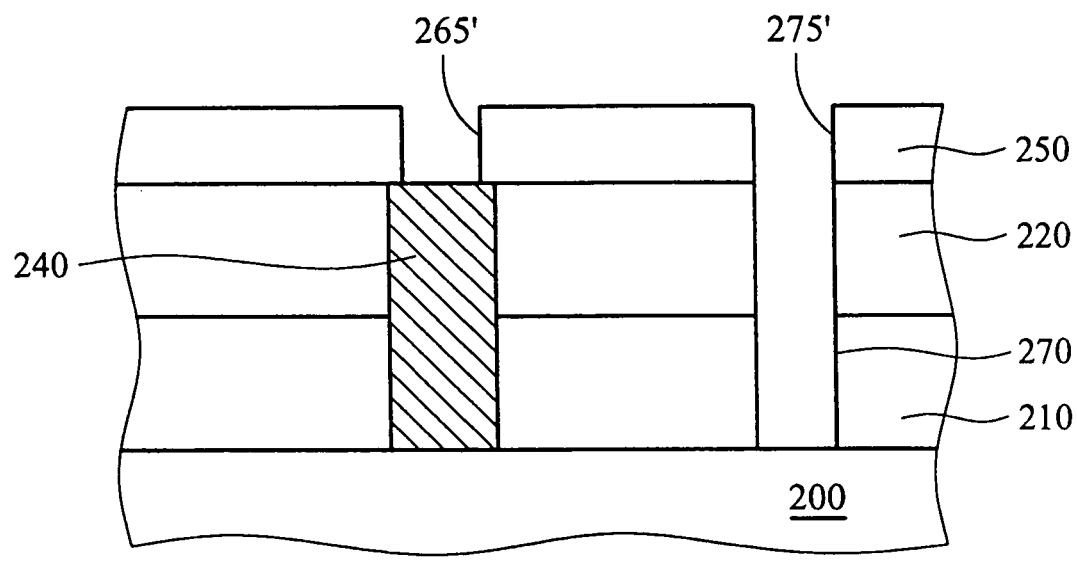

Next, as shown in FIG. 5C, exposure is performed in step S40B to simultaneously define a contact hole in a peripheral 270 and a first bitline trench 265' in the second dielectric layer corresponding to the position of the first conductive layer 240. Then, a second bitline trench 275' is formed in the second dielectric layer 250 to expose the contact hole in a peripheral 270.

Figure 5D:
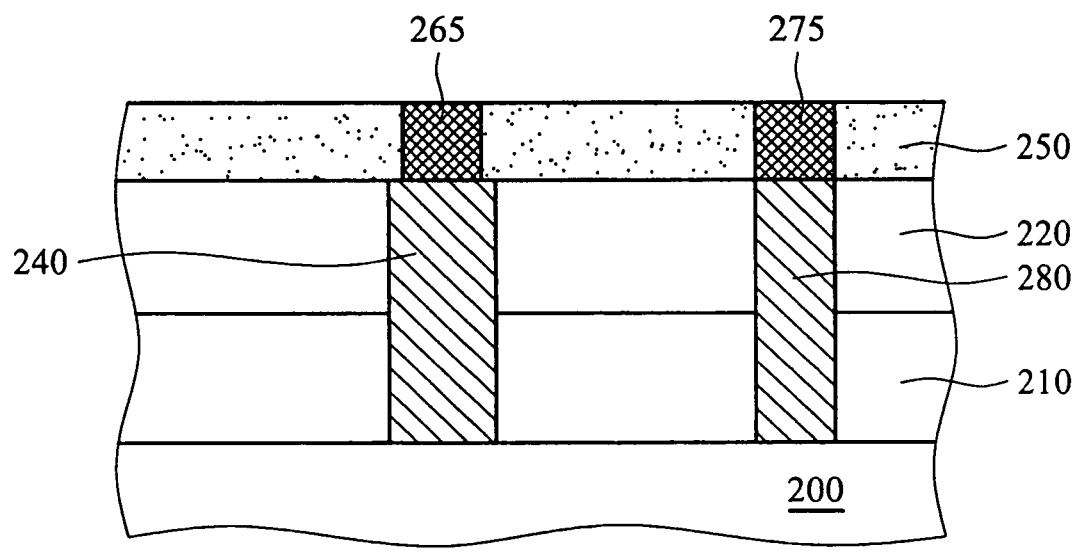

Finally, as shown in FIG. 5D, conductive material fills the contact hole in a peripheral 270, the first bitline trench 265' and the second bitline trench 275' in step S50 to form a contact to a peripheral 280, a first bitline 265, and a second bitline 275. Conductive material is preferably tungsten, but other metal such as titanium is applicable as well.

After the above steps, chemical mechanical polishing (CMP) polishes the surface of the bitlines and removes excess metal to obtain a smooth surface.

The bitline structures formed according to the method for forming bitlines for DRAM of the present invention are shown in FIGS. 4E and 5D. The two structures are substantially the same, both including a substrate 100/200, a first dielectric layer 105/205, bitline contacts 140/240 formed in the first dielectric layer, a second dielectric layer 150/250 formed on the first dielectric layer and covering the bitline contacts, and bitlines 165/265, formed in the second dielectric layer and contacting the bitline contacts. FIG. 4E further shows a bitline contact landing 145, formed between the first bitline 165 and the bitline contact 140. The above structures are formed by further forming a dielectric layer to cover the contact, followed by definition of the bitline trenches.

Figure 6A:
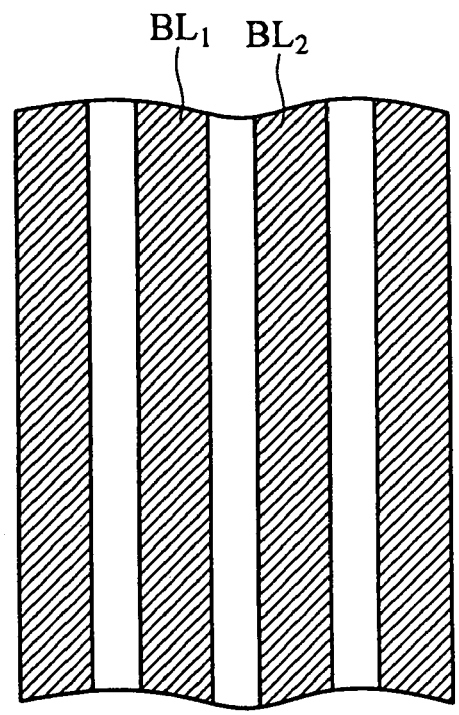
FIGS. 6A, 6B are top views showing bitlines of DRAM according to the invention and conventional method.
Figure 6B:
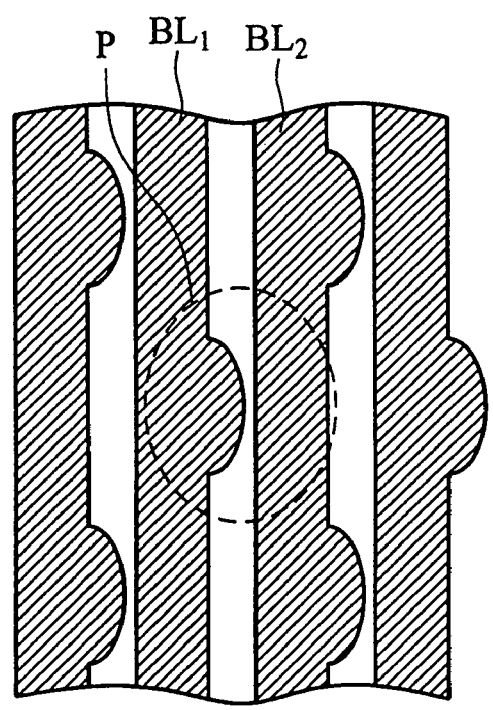

In order to clearly illustrate the outcome of the present invention, FIGS. 6A and 6B illustrate top views of the bitline structures formed. In FIG. 6A, outlines of the bitlines BL1 and BL2 are straight without overlap, while FIG. 6B illustrates shorts caused by overlapping bitlines. In addition to prevention of overlap, the overlay margbetween bitlines is also increased. This greatly improves the semiconductor process, thereby increasing production yield.

According to theinvention, a single mask defines the contact to a peripheral and bitline trench simultaneously, such that no additional mask is required. Also, the bitline trenches are aligned with the contact to bitline, instead of gate. Therefore, misalignment between the bitline trench and the contact to bitline is also resolved. According to the first Embodiment, the formation of the bitline contact landing having a greater area also increases contact between the bitline and the contact to bitline. This is advantageous for the overall semiconductor process and improves production yields.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bitline structure for DRAM, comprising:
a substrate;
a first dielectric layer, formed on the substrate;

a bitline contact hole, through the first dielectric layer;
a bitline contact, formed in the bitline contact hole;
a bitline contact landing, formed above the bitline contact;
a second dielectric layer, formed on the first dielectric layer and covering the bitline contact landing;
a peripheral contact hole, formed through the first dielectric layer and the second dielectric layer;
a peripheral contact, formed in the peripheral contact hole;
a first bitline, formed in the second dielectric layer and contacting the bitline contact landing; and
a second bitline, formed in the second dielectric layer and contacting the peripheral contact.

2. The structure as claimed in claim 1, the bitline contact landing further comprising a portion wider than the first bitline, formed in the first dielectric layer, between the bitline contact and the first bitline and connecting both.

3. The structure as claimed in claim 1, wherein the bitline contact is polysilicon.

4. The structure as claimed in claim 1, wherein the first dielectric layer is a boron phosphorous silicon glass and tetraethylorthosilane layer.

5. The structure as claimed in claim 1, wherein the second dielectric layer is a tetraethylorthosilane layer.

6. The structure as claimed in claim 1, wherein the peripheral contact, the first bitline and the second bitline are tungsten.

* * * * *